United States Patent
Kang et al.

(10) Patent No.: US 7,253,081 B2
(45) Date of Patent: Aug. 7, 2007

(54) SURFACE FINISHING OF SOI SUBSTRATES USING AN EPI PROCESS

(75) Inventors: Sien G. Kang, Pleasanton, CA (US); Igor J. Malik, Palo Alto, CA (US)

(73) Assignee: Silicon Genesis Corporation, San Jose, CA (US)

( * ) Notice: Subject to any disclaimer, the term of this patent is extended or adjusted under 35 U.S.C. 154(b) by 0 days.

(21) Appl. No.: 09/893,340

(22) Filed: Jun. 26, 2001

(65) Prior Publication Data

US 2002/0022344 A1    Feb. 21, 2002

Related U.S. Application Data

(63) Continuation of application No. 09/399,985, filed on Sep. 20, 1999, now Pat. No. 6,287,941.

(60) Provisional application No. 60/130,423, filed on Apr. 21, 1999, now abandoned.

(51) Int. Cl.
*H01L 21/30* (2006.01)
(52) U.S. Cl. ............... 438/458; 438/459; 438/479; 438/967
(58) Field of Classification Search ............ 438/503, 438/458, 459, 479, 967
See application file for complete search history.

(56) References Cited

U.S. PATENT DOCUMENTS

| | | | |
|---|---|---|---|
| 3,964,957 A | 6/1976 | Walsh | |
| 4,495,219 A | 1/1985 | Kato et al. | |
| 4,530,149 A * | 7/1985 | Jastrzebski et al. | 438/156 |
| 4,906,594 A | 3/1990 | Yoneda et al. | |
| 5,141,878 A * | 8/1992 | Benton et al. | 257/461 |
| 5,198,071 A | 3/1993 | Scudder et al. | |
| 5,198,371 A | 3/1993 | Li | |
| 5,213,986 A | 5/1993 | Pinker et al. | |

(Continued)

FOREIGN PATENT DOCUMENTS

DE    19753494 A    10/1998

(Continued)

OTHER PUBLICATIONS

Moriceau et al. "Hydrogen annealing treatment used to obtain high quality SOI surfaces" IEEE International SOI Conference, Oct. 1998, pp. 37-38.*

(Continued)

*Primary Examiner*—Jack Chen
(74) *Attorney, Agent, or Firm*—Townsend and Townsend and Crew LLP (57) ABSTRACT

A method for treating a film of material, which can be defined on a substrate, e.g., silicon. The method includes providing a substrate comprising a cleaved surface, which is characterized by a predetermined surface roughness value. The substrate also has a distribution of hydrogen bearing particles defined from the cleaved surface to a region underlying said cleaved surface. The method also includes increasing a temperature of the cleaved surface to greater than about 1,000 Degrees Celsius while maintaining the cleaved surface in an etchant bearing environment to reduce the predetermined surface roughness value by about fifty percent and greater. Preferably, the value can be reduced by about eighty or ninety percent and greater, depending upon the embodiment.

17 Claims, 4 Drawing Sheets

U.S. PATENT DOCUMENTS

| | | |
|---|---|---|
| 5,374,564 A | 12/1994 | Bruel |
| 5,403,434 A | 4/1995 | Moslehi |
| 5,409,563 A | 4/1995 | Cathey |
| 5,427,052 A | 6/1995 | Ohta et al. |
| 5,494,835 A | 2/1996 | Bruel |
| 5,506,176 A | 4/1996 | Takizawa |
| 5,508,207 A | 4/1996 | Horai et al. |
| 5,518,965 A | 5/1996 | Menigaux |
| 5,559,043 A | 9/1996 | Bruel |
| 5,686,980 A | 11/1997 | Hirayama et al. |
| 5,705,421 A | 1/1998 | Matsushita et al. |
| 5,714,395 A | 2/1998 | Bruel |
| 5,841,931 A | 11/1998 | Foresi |
| 5,854,123 A | 12/1998 | Sato et al. |
| 5,869,387 A | 2/1999 | Sato et al. |
| 5,869,405 A | 2/1999 | Gonzalez et al. |
| 5,877,070 A | 3/1999 | Goesele et al. |
| 5,966,620 A | 10/1999 | Sakaguchi et al. |
| 5,966,625 A | 10/1999 | Zhong et al. |
| 5,968,279 A | 10/1999 | MacLeish et al. |
| 6,004,868 A | 12/1999 | Rolfson et al. |
| 6,008,128 A * | 12/1999 | Habuka et al. ............. 438/695 |
| 6,107,213 A | 8/2000 | Tayanaka |
| 6,143,628 A | 11/2000 | Sato et al. |
| 6,162,705 A | 12/2000 | Henley et al. |
| 6,171,965 B1 | 1/2001 | Kang et al. |
| 6,171,982 B1 | 1/2001 | Sato |
| 6,194,327 B1 | 2/2001 | Gonzalez et al. |
| 6,204,151 B1 | 3/2001 | Malik et al. |
| 6,214,701 B1 | 4/2001 | Matsushita et al. |
| 6,251,754 B1 * | 6/2001 | Ohshima et al. ............ 438/406 |
| 6,274,464 B2 * | 8/2001 | Drobny et al. .............. 438/507 |
| 6,287,941 B1 | 9/2001 | Kang et al. |
| 6,335,269 B1 * | 1/2002 | Sato ........................... 438/509 |
| 6,342,436 B1 * | 1/2002 | Takizawa ..................... 438/473 |

FOREIGN PATENT DOCUMENTS

| | | |
|---|---|---|
| EP | 0296804 A | 12/1988 |
| EP | 553 852 | 8/1993 |
| EP | 553852 A2 * | 8/1993 |
| EP | 905 767 | 3/1999 |
| EP | 961 312 | 12/1999 |
| EP | 0971395 A | 1/2000 |
| JP | 2000 94317 | 4/2000 |

OTHER PUBLICATIONS

Tate et al. ("Defect Reduction of Bonded SOI Wafers by Post Anneal Process in H2 Ambient" IEEE International SOI Conference Proceedings, Oct. 5-8, 1998, pp. 141-142.*

Merriam Webster's Collegiate Dictionary, 1998 10th ed., p. 388.*

Habuka et al. "Change in Microroughness of a Silicon Surface during In Situ Cleaning Using HF and HCl Gases," J. Electrochem. Soc., 145:4264-4271 (1998).

Centura Epi "Epitaxial Deposition Chamber Specifications" Brochure, Applied Materials, Mar. 1994.

EPI CENTURA System Specifications Brochure, Applied Materials, Oct. 1996.

Mahajan et al., *Principles of Growth and Processing of Semiconductors*, WCB McGraw-Hill, chapter 6, pp. 262-269, 1999.

Sato et al., "Suppression of Si Etching during Hydrogen Annealing of Silicon-on-Insulator," *Proceedings 1998 IEEE SOI Conference*, pp. 17-18, from conference of Oct. 5-8, 1998.

Smith, D.L., *Thin-Film Deposition*, McGraw-Hill, Inc., pp. 185-196, 278-293, 1995.

Tong et al., *Semiconductor Wafer Bonding: Science and Technology*, John Wiley & Sons, Inc., pp. 152-171, 1999.

* cited by examiner

SURFACE FINISHING OF SOI SUBSTRATES USING AN EPI PROCESS

This is a continuation of U.S. patent application Ser. No. 09/399,985, filed on Sep. 20, 1999, now U.S. Pat. No. 6,287,941, which claims priority to U.S. Provisional Patent Application No. 60/130,423, filed on Apr. 21, 1999, now abandoned which are incorporated by reference herein for all purposes.

BACKGROUND OF THE INVENTION

The present invention relates to the manufacture of objects. More particularly, the present invention provides a technique for improving surface texture or surface characteristics of a film of material, e.g., silicon, silicon germanium, or others. The present invention can be applied to treating or smoothing a cleaved film from a layer transfer process for the manufacture of integrated circuits, for example. But it will be recognized that the invention has a wider range of applicability; it can also be applied to smoothing a film for other substrates such as multi-layered integrated circuit devices, three-dimensional packaging of integrated semiconductor devices, photonic devices, piezoelectronic devices, microelectromechanical systems ("MEMS"), sensors, actuators, solar cells, flat panel displays (e.g., LCD, AMLCD), doping semiconductor devices, biological and biomedical devices, and the like.

Integrated circuits are fabricated on chips of semiconductor material. These integrated circuits often contain thousands, or even millions, of transistors and other devices. In particular, it is desirable to put as many transistors as possible within a given area of semiconductor because more transistors typically provide greater functionality, and a smaller chip means more chips per wafer and lower costs. Some integrated circuits are fabricated on a slice or wafer, of single-crystal (monocrystalline) silicon, commonly termed a "bulk" silicon wafer. Devices on such "bulk" silicon wafer typically are isolated from each other. A variety of techniques have been proposed or used to isolate these devices from each other on the bulk silicon wafer, such as a local oxidation of silicon ("LOCOS") process, trench isolation, and others. These techniques, however, are not free from limitations. For example, conventional isolation techniques consume a considerable amount of valuable wafer surface area on the chip, and often generate a non-planar surface as an artifact of the isolation process. Either or both of these considerations generally limit the degree of integration achievable in a given chip. Additionally, trench isolation often requires a process of reactive ion etching, which is extremely time consuming and can be difficult to achieve accurately.

An approach to achieving very-large scale integration ("VLSI") or ultra-large scale integration ("ULSI") is by using a semiconductor-on-insulator ("SOI") wafer. An SOI wafer typically has a layer of silicon on top of a layer of an insulator material. A variety of techniques have been proposed or used for fabricating the SOI wafer. These techniques include, among others, growing a thin layer of silicon on a sapphire substrate, bonding a layer of silicon to an insulating substrate, and forming an insulating layer beneath a silicon layer in a bulk silicon wafer. In an SOI integrated circuit, essentially complete device isolation is often achieved using conventional device processing methods by surrounding each device, including the bottom of the device, with an insulator. An advantage SOI wafers have over bulk silicon wafers is that the area required for isolation between devices on an SOI wafer is less than the area typically required for isolation on a bulk silicon wafer.

SOI offers other advantages over bulk silicon technologies as well. For example, SOI offers a simpler fabrication sequence compared to a bulk silicon wafer. Devices fabricated on an SOI wafer may also have better radiation resistance, less photo-induced current, and less cross-talk than devices fabricated on bulk silicon wafers. Many problems, however, that have already been solved regarding fabricating devices on bulk silicon wafers remain to be solved for fabricating devices on SOI wafers.

For example, SOI wafers generally must also be polished to remove any surface irregularities from the film of silicon overlying the insulating layer. Polishing generally includes, among others, chemical mechanical polishing, commonly termed CMP. CMP is generally time consuming and expensive, and can be difficult to perform cost efficiently to remove surface non-uniformities. That is, a CMP machine is expensive and requires large quantities of slurry mixture, which is also expensive. The slurry mixture can also be highly acidic or caustic. Accordingly, the slurry mixture can influence functionality and reliability of devices that are fabricated on the SOI wafer.

From the above, it is seen that an improved technique for manufacturing a substrate such as an SOI wafer is highly desirable.

SUMMARY OF THE INVENTION

According to the present invention, a technique for treating a film of material is provided. More particularly, the present invention provides a method for treating a cleaved surface and/or an implanted surface using a combination of thermal treatment and chemical reaction, which can form a substantially smooth film layer from the cleaved surface.

In an alternative embodiment, the present invention provides a method for treating a film of material, which can be defined on a substrate, e.g., silicon. The method includes providing a substrate comprising a cleaved surface, which is characterized by a predetermined surface roughness value. The substrate also has a distribution of hydrogen bearing particles defined from the cleaved surface to a region underlying the cleaved surface. The method also includes increasing a temperature of the cleaved surface to greater than about 1,000 Degrees Celsius while maintaining the cleaved surface in a hydrogen etchant bearing environment to reduce the predetermined surface roughness value by about fifty percent and greater. Other embodiments include a temperature range from about 900 to about 1,000 Degrees Celsius and greater for silicon. Preferably, the value can be reduced by about eighty or ninety percent and greater, depending upon the embodiment.

Numerous benefits are achieved by way of the present invention over pre-existing techniques. For example, the present invention provides an efficient technique for forming a substantially uniform surface on an SOI wafer. Additionally, the substantially uniform surface is made by way of common hydrogen treatment and etching techniques, which can be found in conventional epitaxial tools. Furthermore, the present invention provides a novel uniform layer, which can be ready for the manufacture of integrated circuits. The present invention also relies upon standard fabrication gases such as HCl and hydrogen gas. In preferred embodiments, the present invention can improve bond interface integrity, improve crystal structure, and reduce defects in the substrate simultaneously during the process. Depending upon the embodiment, one or more of these benefits is present. These and other advantages or benefits are described throughout the present specification and are described more particularly below.

These and other embodiments of the present invention, as well as its advantages and features are described in more detail in conjunction with the text below and attached Figs.

DESCRIPTION OF THE SPECIFIC EMBODIMENT

According to the present invention, a technique for treating a film of material is provided. More particularly, the present invention provides a method for treating a cleaved surface and/or an implanted surface using a combination of thermal treatment and chemical reaction, which can form a substantially smooth film layer from the cleaved surface. The invention will be better understood by reference to the Figs. and the descriptions below.

A process for fabricating a silicon-on-insulator substrate according to the present invention may be briefly outlined as follows:

(1) Provide a donor silicon wafer (which may be coated with a dielectric material);
(2) Introduce particles into the silicon wafer to a selected depth to define a thickness of silicon film;
(3) Provide a target substrate material (which may be coated with a dielectric material);
(4) Bond the donor silicon wafer to the target substrate material by joining the implanted face to the target substrate material;
(5) Increase global stress (or energy) of implanted region at selected depth without initiating a cleaving action (optional);
(6) Provide stress (or energy) using a fluid jet to a selected region of the bonded substrates to initiate a controlled cleaving action at the selected depth;
(7) Provide additional energy to the bonded substrates to sustain the controlled cleaving action to free the thickness of silicon film from the silicon wafer (optional);
(8) Complete bonding of donor silicon wafer to the target substrate (optional);
(9) Finish surface of cleaved film by etching and hydrogen treatment;
(10) Form epitaxial layer (e.g., silicon, silicon germanium) overlying finished surface; and
(11) Perform remaining steps, if necessary.

The above sequence of steps provides a step of initiating a controlled cleaving action using an energy applied to a selected region(s) of a multi-layered substrate structure to form a cleave front(s) according to the present invention. This initiation step begins a cleaving process in a controlled manner by limiting the amount of energy applied to the substrate. Further propagation of the cleaving action can occur by providing additional energy to selected regions of the substrate to sustain the cleaving action, or using the energy from the initiation step to provide for further propagation of the cleaving action. The steps are also used to finish the cleaved surface using a combination of etch and hydrogen treatment for silicon wafer, for example. This sequence of steps is merely an example and should not limit the scope of the claims defined herein. Further details with regard to the above sequence of steps are described in below in references to the Figs.

Figure 1:
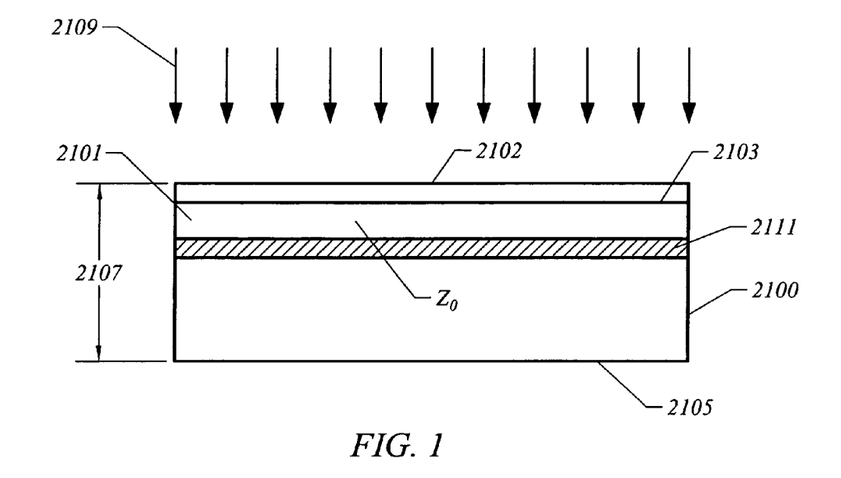
FIGS. 1-5 are simplified cross-sectional view diagrams illustrating a method of forming a silicon-on-insulator substrate according to the present invention.

FIGS. 1-5 are simplified cross-sectional view diagrams of substrates undergoing a fabrication process for a silicon-on-insulator wafer according to the present invention. The process begins by providing a semiconductor substrate similar to the silicon wafer 2100, as shown by FIG. 1. Substrate or donor includes a material region 2101 to be removed, which is a thin relatively uniform film derived from the substrate material. The silicon wafer includes a top surface 2103, a bottom surface 2105, and a thickness 2107. Material region also includes a thickness ($z_0$), within the thickness 2107 of the silicon wafer. Optionally, a dielectric layer 2102 (e.g., silicon nitride, silicon oxide, silicon oxynitride) overlies the top surface of the substrate. The present process provides a novel technique for removing the material region 2101 using the following sequence of steps for the fabrication of a silicon-on-insulator wafer.

Selected energetic particles 2109 implant through the top surface of the silicon wafer to a selected depth, which defines the thickness of the material region, termed the thin film of material. As shown, the particles have a desired concentration 2111 at the selected depth ($z_0$). A variety of techniques can be used to implant the energetic particles into the silicon wafer. These techniques include ion implantation using, for example, beam line ion implantation equipment manufactured from companies such as Applied Materials, Eaton Corporation, Varian, and others. Alternatively, implantation occurs using a plasma immersion ion implantation ("PIII") technique. Furthermore, implantation can occur using ion shower. Of course, techniques used depend upon the application.

Depending upon the application, smaller mass particles are generally selected to reduce a possibility of damage to the material region. That is, smaller mass particles easily travel through the substrate material to the selected depth without substantially damaging the material region that the particles traversed through. For example, the smaller mass particles (or energetic particles) can be almost any charged (e.g., positive or negative) and/or neutral atoms or molecules, or electrons, or the like. In a specific embodiment, the particles can be neutral and/or charged particles including ions of hydrogen and its isotopes, rare gas ions such as helium and its isotopes, and neon. The particles can also be derived from compounds such as gases, e.g., hydrogen gas, water vapor, methane, and other hydrogen compounds, and other light atomic mass particles. Alternatively, the particles can be any combination of the above particles, and/or ions and/or molecular species and/or atomic species.

Figure 2:
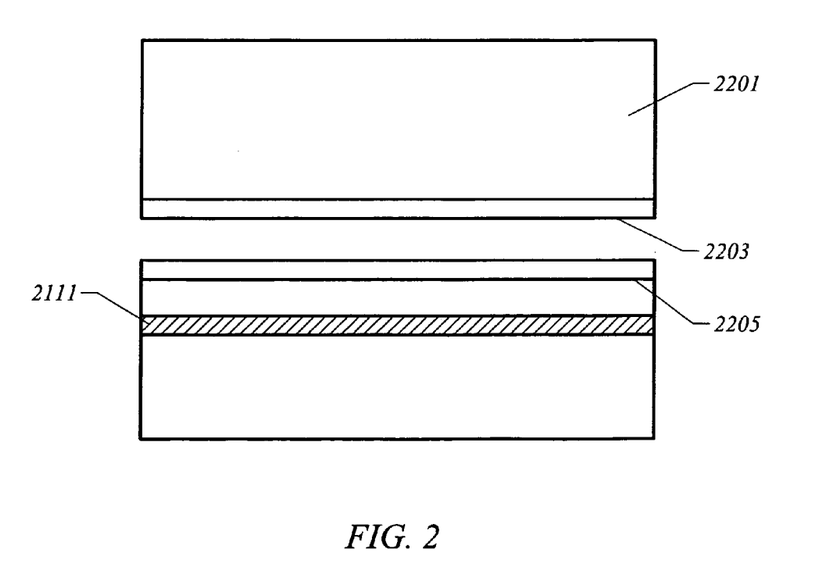

The process uses a step of joining the implanted silicon wafer to a workpiece or target wafer, as illustrated in FIG. 2. The workpiece may also be a variety of other types of substrates such as those made of a dielectric material (e.g., quartz, glass, silicon nitride, silicon dioxide), a conductive material (silicon, polysilicon, group III/V materials, metal), and plastics (e.g., polyimide-based materials). In the present example, however, the workpiece is a silicon wafer.

In a specific embodiment, the silicon wafers are joined or fused together using a low temperature thermal step. The low temperature thermal process generally ensures that the implanted particles do not place excessive stress on the material region, which can produce an uncontrolled cleave action. In one aspect, the low temperature bonding process occurs by a self-bonding process. In particular, one wafer is stripped to remove oxidation therefrom (or one wafer is not oxidized). A cleaning solution treats the surface of the wafer to form O—H bonds on the wafer surface. An example of a solution used to clean the wafer is a mixture of $H_2O_2$—$H_2SO_4$. A dryer dries the wafer surfaces to remove any residual liquids or particles from the wafer surfaces. Self-bonding occurs by placing a face of the cleaned wafer against the face of an oxidized wafer.

Alternatively, a self-bonding process occurs by activating one of the wafer surfaces to be bonded by plasma cleaning. In particular, plasma cleaning activates the wafer surface using a plasma derived from gases such as argon, ammonia, neon, water vapor, and oxygen. The activated wafer surface 2203 is placed against a face of the other wafer, which has a coat of oxidation 2205 thereon. The wafers are in a sandwiched structure having exposed wafer faces. A selected amount of pressure is placed on each exposed face of the wafers to self-bond one wafer to the other.

Alternatively, an adhesive disposed on the wafer surfaces is used to bond one wafer onto the other. The adhesive includes an epoxy, polyimide-type materials, and the like. Spin-on-glass layers can be used to bond one wafer surface onto the face of another. These spin-on-glass ("SOG") materials include, among others, siloxanes or silicates, which are often mixed with alcohol-based solvents or the like. SOG can be a desirable material because of the low temperatures (e.g., 150 to 250 Degrees Celsius) often needed to cure the SOG after it is applied to surfaces of the wafers.

Alternatively, a variety of other low temperature techniques can be used to join the donor wafer to the target wafer. For instance, an electrostatic bonding technique can be used to join the two wafers together. In particular, one or both wafer surface(s) is charged to attract to the other wafer surface. Additionally, the donor wafer can be fused to the target wafer using a variety of commonly known techniques. Of course, the technique used depends upon the application.

Figure 3:
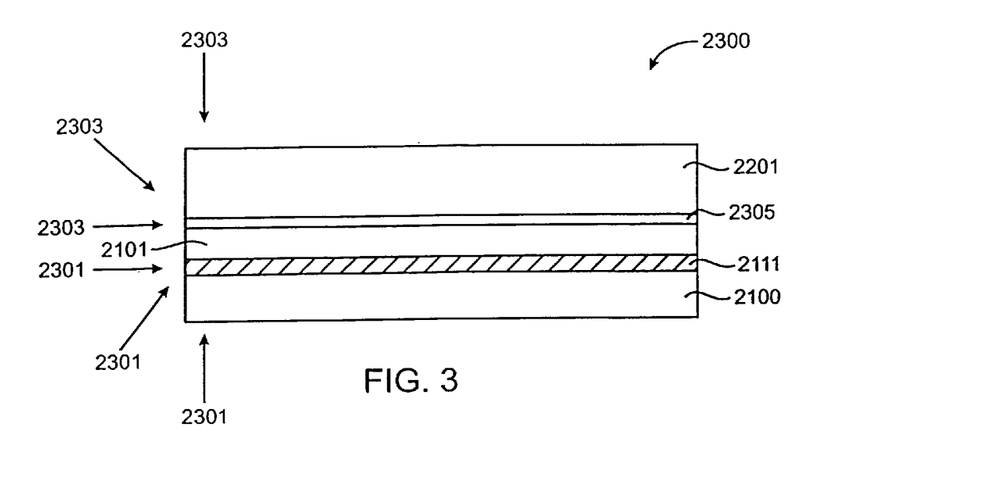

After bonding the wafers into a sandwiched structure 2300, as shown in FIG. 3, the method includes a controlled cleaving action to remove the substrate material to provide a thin film of substrate material 2101 overlying an insulator 2305 the target silicon wafer 2201. The controlled-cleaving occurs by way of selective energy placement or positioning or targeting 2301, 2303 of energy sources onto the donor and/or target wafers. For instance, an energy impulse(s) can be used to initiate the cleaving action. The impulse (or impulses) is provided using an energy source which include, among others, a mechanical source, a chemical source, a thermal sink or source, and an electrical source.

The controlled cleaving action is initiated by way of any of the previously noted techniques and others and is illustrated by way of FIG. 3. For instance, a process for initiating the controlled cleaving action uses a step of providing energy 2301, 2303 to a selected region of the substrate to initiate a controlled cleaving action at the selected depth ($z_0$) in the substrate, whereupon the cleaving action is made using a propagating cleave front to free a portion of the substrate material to be removed from the substrate. In a specific embodiment, the method uses a single impulse to begin the cleaving action, as previously noted. Alternatively, the method uses an initiation impulse, which is followed by another impulse or successive impulses to selected regions of the substrate. Alternatively, the method provides an impulse to initiate a cleaving action which is sustained by a scanned energy along the substrate. Alternatively, energy can be scanned across selected regions of the substrate to initiate and/or sustain the controlled cleaving action.

Optionally, an energy or stress of the substrate material is increased toward an energy level necessary to initiate the cleaving action, but not enough to initiate the cleaving action before directing an impulse or multiple successive impulses to the substrate according to the present invention. The global energy state of the substrate can be raised or lowered using a variety of sources such as chemical, mechanical, thermal (sink or source), or electrical, alone or in combination. The chemical source can include particles, fluids, gases, or liquids. These sources can also include chemical reaction to increase stress in the material region. The chemical source is introduced as flood, time-varying, spatially varying, or continuous. In other embodiments, a mechanical source is derived from rotational, translational, compressional, expansional, or ultrasonic energies. The mechanical source can be introduced as flood, time-varying, spatially varying, or continuous. In further embodiments, the electrical source is selected from an applied voltage or an applied electro-magnetic field, which is introduced as flood, time-varying, spatially varying, or continuous. In still further embodiments, the thermal source or sink is selected from radiation, convection, or conduction. This thermal source can be selected from, among others, a photon beam, a fluid jet, a liquid jet, a gas jet, an electro/magnetic field, an electron beam, a thermoelectric heating, and a furnace. The thermal sink can be selected from a fluid jet, a liquid jet, a gas jet, a cryogenic fluid, a super-cooled liquid, a thermoelectric cooling means, an electro/magnetic field, and others. Similar to the previous embodiments, the thermal source is applied as flood, time-varying, spatially varying, or continuous. Still further, any of the above embodiments can be combined or even separated, depending upon the application. Of course, the type of source used depends upon the application. As noted, the global source increases a level of energy or stress in the material region without initiating a cleaving action in the material region before providing energy to initiate the controlled cleaving action.

In a preferred embodiment, the method maintains a temperature which is below a temperature of introducing the particles into the substrate. In some embodiments, the substrate temperature is maintained between −200 and 450 Degrees Celsius during the step of introducing energy to initiate propagation of the cleaving action. Substrate temperature can also be maintained at a temperature below 400 or below 350 Degrees Celsius. In preferred embodiments, the method uses a thermal sink to initiate and maintain the cleaving action, which occurs at conditions significantly below room temperature.

In an alternative preferred embodiment, the mechanical and/or thermal source can be a fluid jet that is pressurized (e.g., compressional) according to an embodiment of the present invention. The fluid jet (or liquid jet or gas jet) impinges on an edge region of substrate 2300 to initiate the controlled cleaving process. The fluid jet from a compressed or pressurized fluid source is directed to a region at the selected depth 2111 to cleave a thickness of material region 2101 from substrate 2100. The fluid jet separates region 2101 from substrate 2100 that separate from each other at selected depth 2111. The fluid jet can be adjusted to initiate and maintain the controlled cleaving process to separate material 2101 from substrate 2100. Depending upon the application, the fluid jet can be adjusted in direction, location, and magnitude to achieve the desired controlled cleaving process.

Figure 4:
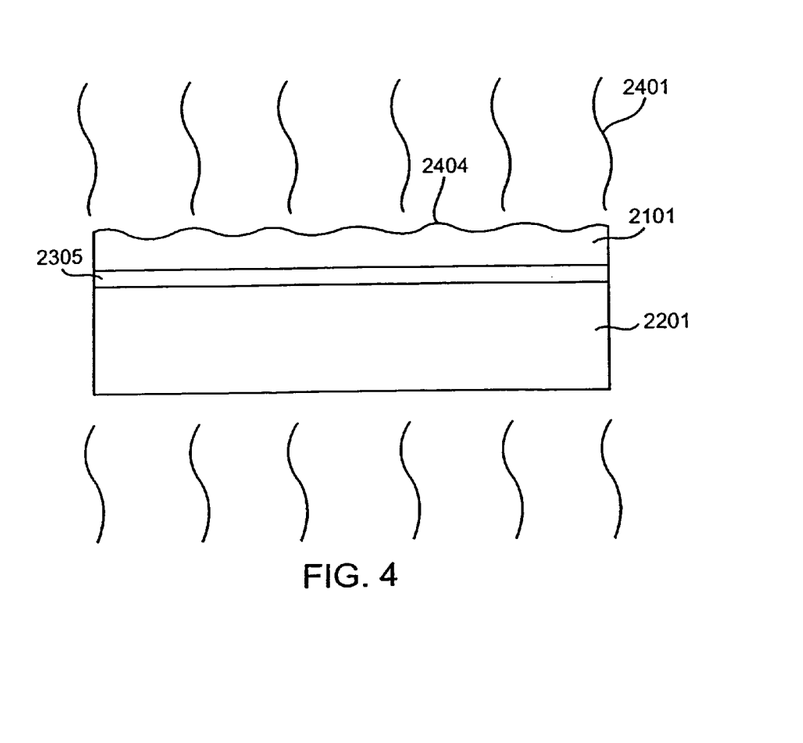

A final bonding step occurs between the target wafer and thin film of material region according to some embodiments, as illustrated by FIG. 4. In one embodiment, one silicon wafer has an overlying layer of silicon dioxide, which is thermally grown overlying the face before cleaning the thin film of material. The silicon dioxide can also be formed using a variety of other techniques, e.g., chemical vapor deposition. The silicon dioxide between the wafer surfaces fuses together thermally in this process.

In some embodiments, the oxidized silicon surface from either the target wafer or the thin film of material region (from the donor wafer) are further pressed together and are subjected to an oxidizing ambient 2401. The oxidizing ambient can be in a diffusion furnace for steam oxidation, hydrogen oxidation, or the like. A combination of the pressure and the oxidizing ambient fuses the two silicon wafers together at the oxide surface or interface 2305. These embodiments often require high temperatures (e.g., 700 Degrees Celsius).

Alternatively, the two silicon surfaces are further pressed together and subjected to an applied voltage between the two wafers. The applied voltage raises temperature of the wafers to induce a bonding between the wafers. This technique limits the amount of crystal defects introduced into the silicon wafers during the bonding process, since substantially no mechanical force is needed to initiate the bonding action between the wafers. Of course, the technique used depends upon the application.

Figure 5:
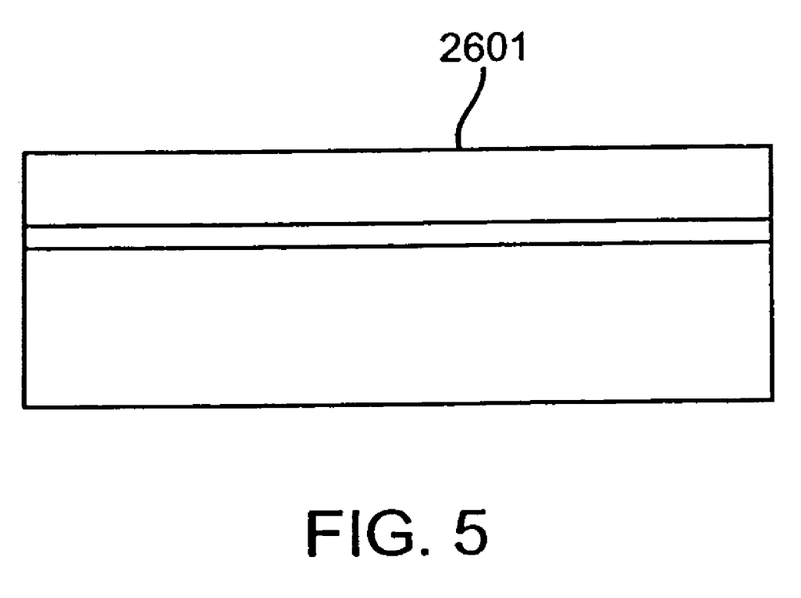

After bonding the wafers, silicon-on-insulator has a target substrate with an overlying film of silicon material and a sandwiched oxide layer between the target substrate and the silicon film, as also illustrated in FIG. 5. The detached surface of the film of silicon material is often rough 2404 and needs finishing. The rough surface for silicon wafers is often about two to eight nanometers RMS or greater. This roughness often should be removed before further processing. In a specific embodiment, the detached surface has a concentration of hydrogen bearing particles therein and thereon from the previous implanting step.

To smooth or treat surface 2404, the substrate is subjected to thermal treatment 2401 in a hydrogen bearing environment. Additionally, the substrate is also subjected to an etchant including a halogen bearing compound such as HCl, HBr, HI, HF, and others. The etchant can also be a fluorine bearing compound such as $SF_6$, $C_xF_x$.

In preferred embodiments, the present substrate undergoes treatment using a combination of etchant and thermal treatment in a hydrogen bearing environment. In a specific embodiment, the etchant is HCl gas or the like. The thermal treatment uses a hydrogen etchant gas. In some embodiments, the etchant gas is a halogenated gas, e.g., HCl, HF, HI, HBr, $SF_6$, $CF_4$, $NF_3$, and $CCl_2F_2$. The etchant gas can also be mixed with another halogen gas, e.g., chlorine, fluorine. The thermal treatment can be from a furnace, but is preferably from a rapid thermal processing tool such as an RTP tool. Alternatively, the tool can be from an epitaxial chamber, which has lamps for rapidly heating a substrate. In an embodiment using a silicon wafer and hydrogen gas, the tool can heat the substrate at a rate of about 10 Degrees Celsius and greater or 20 Degrees Celsius and greater, depending upon the embodiment.

In one embodiment, it is believed that the hydrogen particles in the detached surface improves the surface smoothing process. Here, the hydrogen particles have been maintained at a temperature where they have not diffused out of the substrate. In a specific embodiment, the concentration of hydrogen particles ranges from about $10^{21}$ to about $5\times10^{22}$ atoms/cm$^3$. Alternatively, the concentration of hydrogen particles is at least about $6\times10^{21}$ atoms/cm$^3$. Depending upon the embodiment, the particular concentration of the hydrogen particles can be adjusted.

Still further in other embodiments, the present substrate undergoes a process of hydrogen treatment or implantation before thermal treatment process. Here, the substrate, including the detached film, is subjected to hydrogen bearing particles by way of implantation, diffusion, or any combination thereof. In some embodiments, where hydrogen has diffused out from the initial implant, a subsequent hydrogen treatment process can occur to increase a concentration of hydrogen in the detached film. The present hydrogen treatment process can occur for substrates made by way of the controlled cleaving process, Smart Cut™ process of Soitec SA, and others, which may form an uneven or rough surface finish after detachment. A finished wafer after smoothing or surface treatment is shown in FIG. 5. Here, the finished wafer includes a substantially smooth surface 2601, which is generally good enough for the manufacture of integrated circuits without substantial polishing or the like.

Moreover, the present technique for finishing the cleaved surface can use a combination of etchant, deposition, and thermal treatment to smooth the cleaved film. Here, the cleaved film is subjected to hydrogen bearing compounds such as HCl, HBr, HI, HF, and others. Additionally, the cleaved film is subjected to for example, deposition, during a time that the film is subjected to the hydrogen bearing compounds, which etch portions of the cleaved film. Using a silicon cleaved film for example, the deposition may occur by way of a silicon bearing compound such as silanes, e.g., $Si_xCl_yH_z$, $SiH_4$, $SiCl_x$, and other silicon compounds. Accordingly, the present method subjects the cleaved film to a combination of etching and deposition using a hydrogen bearing compound and a silicon bearing compound. Additionally, the cleaved surface undergoes thermal treatment while being subjected to the combination of etchant and deposition gases The thermal treatment can be from a furnace, but is preferably from a rapid thermal processing tool such as an RTP tool. Alternatively, the tool can be from an epitaxial chamber, which has lamps for rapidly heating a substrate. In an embodiment using a silicon wafer and hydrogen gas, the tool can heat the substrate at a rate of about 10 Degrees Celsius/second and greater or 20 Degrees Celsius/second and greater, depending upon the embodiment.

In a specific embodiment, the silicon-on-insulator substrate undergoes a series of process steps for formation of integrated circuits thereon. These processing steps are described in S. Wolf, Silicon Processing for the VLSI Era (Volume 2), Lattice Press (1990), which is hereby incorporated by reference for all purposes.

Although the above description is in terms of a silicon wafer, other substrates may also be used. For example, the substrate can be almost any monocrystalline, polycrystalline, or even amorphous type substrate. Additionally, the substrate can be made of III/V materials such as gallium arsenide, gallium nitride (GaN), and others. The multi-layered substrate can also be used according to the present invention. The multi-layered substrate includes a silicon-on-insulator substrate, a variety of sandwiched layers on a semiconductor substrate, and numerous other types of substrates. Additionally, the embodiments above were generally in terms of providing a pulse of energy to initiate a controlled cleaving action. The pulse can be replaced by energy that is scanned across a selected region of the substrate to initiate the controlled cleaving action. Energy can also be scanned across selected regions of the substrate to sustain or maintain the controlled cleaving action. One of ordinary skill in the art would easily recognize a variety of alternatives, modifications, and variations, which can be used according to the present invention.

While the above is a full description of the specific embodiments, various modifications, alternative constructions and equivalents may be used. Therefore, the above description and illustrations should not be taken as limiting the scope of the present invention which is defined by the appended claims.

Although the above has been generally described in terms of a PIII system, the present invention can also be applied to a variety of other plasma systems. For example, the present invention can be applied to a plasma source ion implantation system. Alternatively, the present invention can be applied to almost any plasma system where ion bombardment of an exposed region of a pedestal occurs. Accordingly, the above description is merely an example and should not limit the scope of the claims herein. One of ordinary skill in the art would recognize other variations, alternatives, and modifications.

EXPERIMENT

To prove the principle and operation of the present invention, these experiments were performed. It may assist the reader to understand general concepts of layer transfer processes, which are all substantially different. These processes are used to form SOI wafers. There are at least two basic approaches for manufacturing of SOI wafers. The first is SIMOX (Separation by Implantation of Oxygen), which is an early SOI technology that uses oxygen implanted into silicon followed by a high temperature anneal. The second approach is a layer transfer method that are expected to replace SIMOX in the future for volume SOI material manufacturing. These include, possibly among others, BESOI™ (Bonded and Etched Back Silicon on Insulator), ELTRAN® (Epitaxial Layer TRANsfer), involving cleaving along a layer of porous silicon, the Smart Cut™ Process, where a wafer is hydrogen implanted, bonded to another wafer, and thermally cleaved along the implanted layer, and finally, the controlled cleavage process, which was developed by Silicon Genesis Corporation (SiGen). For these last three techniques the surface of the transferred SOI layer is rough, and different methods are used to smooth the surface. A common method is called touch-polishing technique, which involves mechanical cleaning and scrubbing using a CMP apparatus.

In the present example, we desired to improve surface texture/characteristics of an SOI layer that is cleaved using a controlled cleaving process, which can also be used for other processes. The present example uses a combination (including simultaneous) chemical and thermal treatment of the SOI wafer. The present example used an Applied Materials single-wafer atmospheric "epi" chamber called the Epi Centura™. This chamber has two modules with radial lamp arrays to provide radiant heat to the wafer. The chamber had a closed-loop temperature control with programmable PID, which utilizes two optical pyrometers capable of providing independent temperature measurement of both the wafer and the susceptor.

The wafer used was an eight inch silicon wafer. The wafer was implanted using a hydrogen gas. The implant was performed at a dose of $6 \times 10^{16}$ atoms/cm$^2$ and an energy of about 60 KeV. The implanted wafer was bonded to a handle substrate, which was also an eight-inch wafer. The bonded substrate was subjected to a thermal treatment to further bond the substrates together. Once bonding was finalized the bonded substrate was subjected to a cleaving process. Here, the bonded substrates were cleaved using a controlled cleaving process, which splits the implanted surface from the remaining portion of the substrate using a fluidized jet of gas. The cleaved film had a selected concentration of hydrogen bearing particles (up to the implant depth), since cleaving occurred at room temperature, which does not substantially diffuse the hydrogen out of the cleaved surface. The cleaved film from the gas, although very uniform and smooth, still needed some final conditioning.

To condition the surface, the cleaved film was subjected to a combination of thermal treatment and chemical reaction. More particularly, we loaded the cleaved wafer into the epi chamber. Next, we introduced HCl and $H_2$ gases into the epi chamber that exposed the cleaved silicon surface to the gases. The surface was also subjected to a high temperature environment to promote not only a controlled and reversible reaction between silicon and HCl but also to enhance the silicon atom surface mobility. The chamber temperature maintained the substrate to about 1,000 Degrees Celsius, and more particularly about up to 1200 Degrees Celsius. Chamber pressure was generally maintained at about 1 atmosphere, but can be at others too. The HCl flow rate was less than 1 standard liters/minute and the hydrogen gas flow was about 100 standard liters per minute. Other parameters were controlled in a standard manner. Additionally, we believe that the presence of residual $H_2$ molecules in the top SOI surface layer and in the cleaved surface, as a result of the previously performed $H_2$ implantation, further improves the SOI surface modification.

Figure 6:
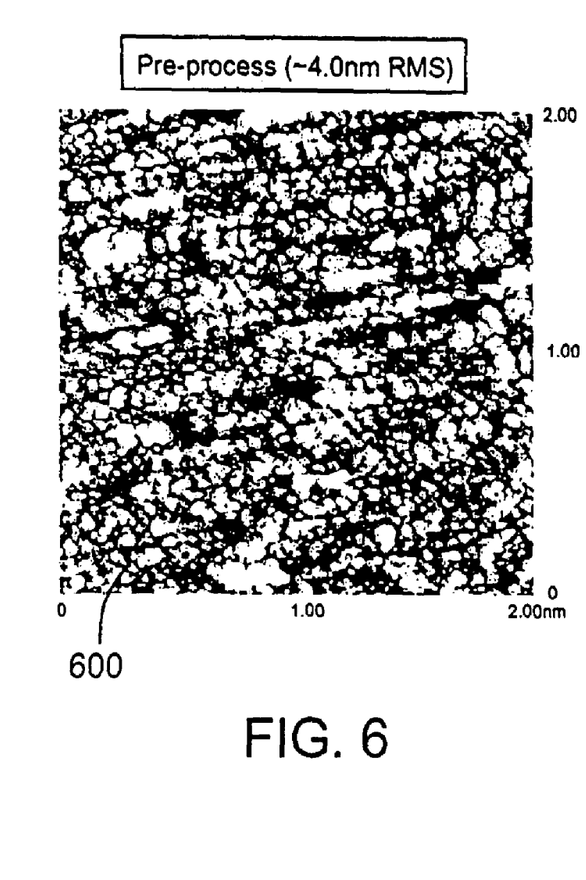
FIGS. 6 and 7 are simplified diagrams of experimental results according to embodiments of the present invention
Figure 7:
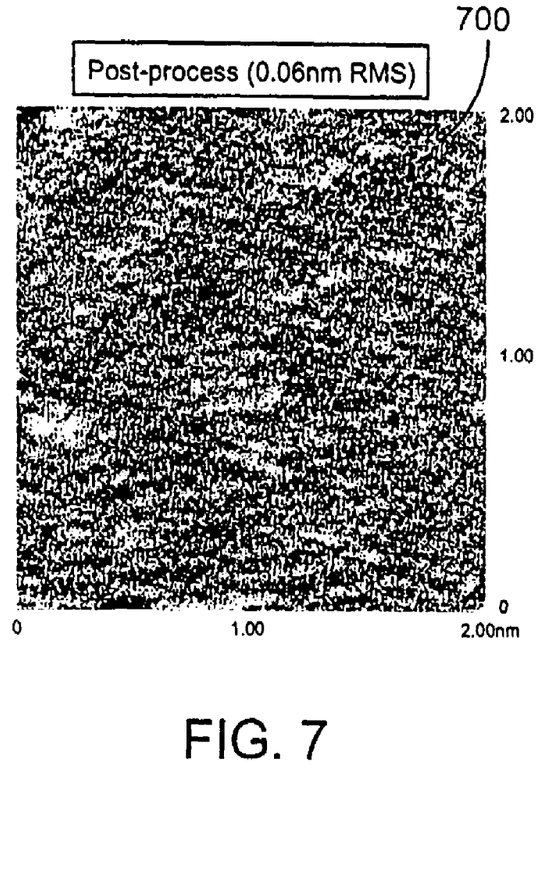

FIGS. 6 and 7 are diagrams of cleaved surfaces, which were measured according to the present invention. The present diagrams are merely examples, which should not limit the scope of the claims herein. Initially, the surfaces, which had been cleaved, were measured for surface roughness. The initial surface roughness ranged from about 4.0-8.0 nm RMS as measured by a Digital Instrument Tapping Mode AFM (Atomic Force Microscopy). These initial roughness measurements 600 are illustrated by an image of FIG. 6. After application of the present method, surface roughness was reduced to less than 0.1 nm. 700, which is shown by an image of FIG. 7. Unlike conventional touch polishing that is limited to removing a few tens nm., the present experiment can be used to reduce the SOI layer thickness up to a few hundreds nanometers or even tens of nanometers without degrading the layer uniformity. For a thicker layer to be removed, a combination of high and low removal rates may be employed while still maintaining excellent SOI surface characteristics. Additionally, the present method is dry, which is substantially free from wet batch chemicals and the like, in some applications. Accordingly, we demonstrated some of the benefits of the present invention using our experiments over conventional techniques.

This experiment was merely an example, which should not limit the scope of the claims. One of ordinary skill in the art would recognize many other variations, alternatives, and modifications. For example, the process can be carried out different temperatures, different pressures, flow rates, chemicals, and the like, without departing from the scope of the claims herein.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A dry method for finishing SOI substrates, said method comprising:
   providing an SOI substrate comprising a cleaved surface, said cleaved surface having a first surface roughness value;
   performing a hydrogen treatment to increase a concentration of hydrogen of said cleaved surface; and
   performing an etchant and thermal treatment after the hydrogen treatment, the etchant and thermal treatment comprising:
      increasing a temperature of an environment associated with said cleaved surface to greater than about 1,000° Celsius; and
      contacting said cleaved surface with a hydrogen bearing environment at least when said temperature of said environment is greater than about 1,000° Celsius to reduce said first surface roughness value by at least about eighty percent to a second surface roughness value, said hydrogen bearing environment including at least an HCl gas and a hydrogen gas;
   whereupon the cleaved surface having the second roughness value is substantially planarized.

2. The method of claim 1 wherein the increasing the temperature is provided at a rate of about 10 Degrees Celsius per second and greater.

3. The method of claim 1 wherein said first surface roughness value is reduced by at least about ninety percent to the second roughness value.

4. The method of claim 1 wherein said HCl gas and said hydrogen gas are a ratio (HCl:$H_2$) of about 0.001 to 30.

5. The method of claim 1, wherein said hydrogen gas and the HCl gas interact with said cleaved surface to reduce said surface roughness value.

6. The method of claim 1 wherein said first surface roughness value of said cleaved surface is reduced in a thermal processing chamber.

7. The method of claim 1 wherein cleaved surface is provided by a controlled cleavage process.

8. The method of claim 1 wherein said SOI substrate is fabricated from a donor silicon wafer.

9. The method of claim 1 wherein said cleaved surface is raised to a temperature of at least about 1,000° Celsius.

10. The method of claim 1 wherein said environment is a process chamber wherein said substrate is provided.

11. The method of claim 1 wherein the environment is maintained at a pressure of about 1 atmosphere.

12. The method of claim 1 wherein said SOI substrate is a wafer whereon a plurality of fabrication processes are performed to define a plurality of transistors on said substantially planarized surface.

13. The method of claim 1, wherein said SOI substrate is a wafer having a main surface, said main surface being planarized in its entirety by said increasing a temperature and contacting steps, wherein a plurality of devices are fabricated on said planarized main surface.

14. The method of claim 1 wherein the hydrogen treatment increases the concentration of hydrogen of said cleaved surface to a range of $10^{21}$ and $5 \times 10^{22}$ atoms/$cm^3$.

15. The method of claim 1 wherein the hydrogen treatment comprises at least one of implantation, diffusion, or a combination of implantation and diffusion.

16. The method of claim 1 wherein said temperature of said environment is in the range of 1,000° Celsius and 1,200° Celsius.

17. A dry method for finishing SOI wafers, said method comprising:
   providing an SOI wafer comprising a main surface that has been cleaved, said cleaved main surface having a first surface roughness value;
   performing a hydrogen treatment to increase a hydrogen concentration of said cleaved main surface; and
   performing an etchant and thermal treatment after the hydrogen treatment, the etchant and thermal treatment comprising:
      increasing a temperature of an environment associated with said cleaved main surface to greater than about 1,000° Celsius; and
      contacting said cleaved main surface with a hydrogen bearing environment at least when said temperature of said environment is greater than about 1,000° Celsius to reduce said first surface roughness value by at least about eighty percent to a second surface roughness value, said hydrogen bearing environment including at least an HCl gas and a hydrogen gas;
   wherein the main surface is substantially planarized in its entirety to the second roughness value, the planarized main surface providing a surface whereon a plurality of devices are later defined.

* * * * *